(12) United States Patent
Kliever

(10) Patent No.: US 11,509,081 B2
(45) Date of Patent: Nov. 22, 2022

(54) PRINTED CIRCUIT BOARD PLUG-IN CONNECTION

(71) Applicant: HARTING ELECTRIC GMBH & CO. KG, Espelkamp (DE)

(72) Inventor: Wilhelm Kliever, Minden (DE)

(73) Assignee: HARTING Electric GmbH & Co. KG, Espelkamp (DE)

( * ) Notice: Subject to any disclaimer, the term of this patent is extended or adjusted under 35 U.S.C. 154(b) by 0 days.

(21) Appl. No.: 17/055,520

(22) PCT Filed: May 10, 2019

(86) PCT No.: PCT/DE2019/100428
§ 371 (c)(1),
(2) Date: Nov. 13, 2020

(87) PCT Pub. No.: WO2019/219125
PCT Pub. Date: Nov. 21, 2019

(65) Prior Publication Data
US 2021/0203095 A1     Jul. 1, 2021

(30) Foreign Application Priority Data

May 16, 2018 (DE) .................... 10 2018 111 733.7

(51) Int. Cl.
*H01R 12/75*     (2011.01)
*H01R 13/514*     (2006.01)
(Continued)

(52) U.S. Cl.
CPC ......... *H01R 12/75* (2013.01); *H01R 12/7023* (2013.01); *H01R 12/7052* (2013.01);
(Continued)

(58) Field of Classification Search
CPC .. H01R 12/7023; H01R 12/75; H01R 13/052; H01R 13/514; H01R 13/58; H05K 1/115; H05K 2201/0963; H05K 2201/09072
See application file for complete search history.

(56) References Cited

U.S. PATENT DOCUMENTS

| 4,526,429 A | * | 7/1985 | Kirkman | ................ H01R 12/58 |
| | | | | 439/751 |
| 5,752,851 A | * | 5/1998 | Zaderej | .................. H05K 3/365 |
| | | | | 439/493 |

(Continued)

FOREIGN PATENT DOCUMENTS

| DE | 92 12 395.3 U1 | 11/1992 |
| DE | 197 36 739 A1 | 3/1999 |

(Continued)

OTHER PUBLICATIONS

European Patent Office, International Search Report and Written Opinion for international application No. PCT/DE2019/100428, dated Aug. 14, 2019, 12 pages (with English translation of International Search Report).

(Continued)

*Primary Examiner* — Vanessa Girardi
(74) *Attorney, Agent, or Firm* — Seed IP Law Group LLP

(57) ABSTRACT

A printed circuit board plug-in connection is provided for transmitting the highest possible currents between a printed circuit board and an electrical cable, the printed circuit board plug-in connection being manufactured as simply and economically as possible. For this purpose, a plug-in connection having a slotted pin contact is proposed. Said pin contact is arranged in an insulating body and can be inserted directly into a passage contact opening of a printed circuit board in order to establish electrical contact. The insulating body has detent arms, which releasably engage in detent openings of the printed circuit board in a locking manner at the same (Continued)

time. By means of dovetail connections, several insulating bodies can be fastened to each other, i.e., can be cascaded with each other. A strain relief element can also be fastened to an insulating body by means of the dovetail connection in order to provide strain relief for individual conductors of the cable.

22 Claims, 4 Drawing Sheets

(51) Int. Cl.
  *H01R 13/58*  (2006.01)
  *H05K 1/11*  (2006.01)
  *H01R 12/70*  (2011.01)
  *H01R 13/05*  (2006.01)
(52) U.S. Cl.
  CPC ......... *H01R 13/052* (2013.01); *H01R 13/514* (2013.01); *H01R 13/58* (2013.01); *H05K 1/115* (2013.01); *H05K 2201/09063* (2013.01); *H05K 2201/09072* (2013.01)

(56) References Cited

U.S. PATENT DOCUMENTS

| | | | | |
|---|---|---|---|---|
| 6,486,406 B1* | 11/2002 | Greco | .................... | H05K 7/142 |
| | | | | 174/138 R |
| 6,881,100 B2* | 4/2005 | Barry | .................. | H01R 13/514 |
| | | | | 439/701 |
| 8,632,346 B2* | 1/2014 | Wittig | .................... | H01R 4/184 |
| | | | | 439/82 |
| 9,577,356 B2 | 2/2017 | Müller | | |
| 9,711,882 B2* | 7/2017 | Brar | .................... | H01R 12/7023 |
| 2005/0059279 A1* | 3/2005 | Zu | ...................... | H01R 13/6597 |
| | | | | 439/92 |
| 2006/0110978 A1 | 5/2006 | Fan et al. | | |
| 2012/0108083 A1 | 5/2012 | Wittig et al. | | |
| 2016/0315435 A1 | 10/2016 | Trapp | | |
| 2018/0109026 A1 | 4/2018 | Kurumaddali | | |
| 2018/0316111 A1 | 11/2018 | Lubeley et al. | | |

FOREIGN PATENT DOCUMENTS

| | | | |
|---|---|---|---|
| DE | 101 24 610 A1 | 11/2002 | |
| DE | 20 2009 018 730 U1 | 1/2013 | |
| DE | 10 2015 204 119 A1 | 9/2016 | |
| EP | 0 007 188 B1 | 12/1981 | |
| EP | 1 041 675 A2 | 10/2000 | |
| EP | 2 572 405 B1 | 2/2016 | |
| EP | 3 066 723 B1 | 12/2017 | |
| WO | 2010/063459 A1 | 6/2010 | |
| WO | 2016/184673 A1 | 11/2016 | |

OTHER PUBLICATIONS

German Patent Office, Office Action for German application No. 10 2018 111 733.7 dated Jun. 28, 2019, 9 pages.

International Preliminary Report on Patentability, dated Nov. 17, 2020; for International Application No. PCT/DE2019/100428, 8 pages.

* cited by examiner

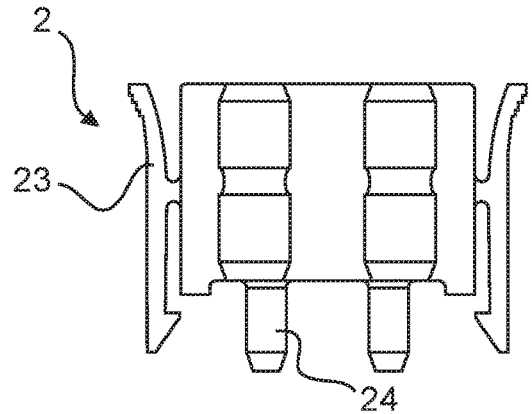
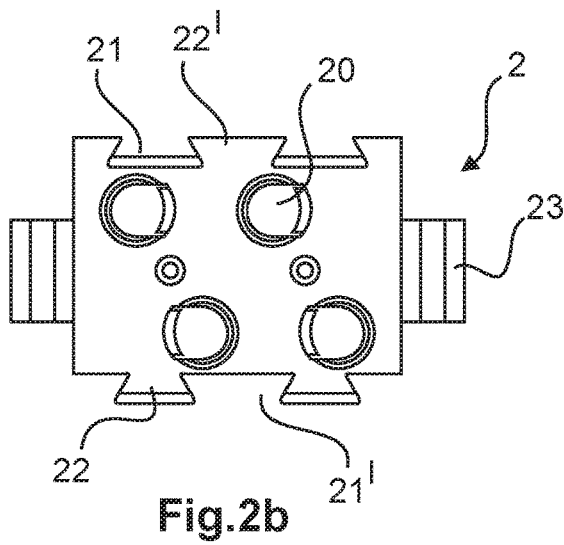
Fig.2a        Fig.2b
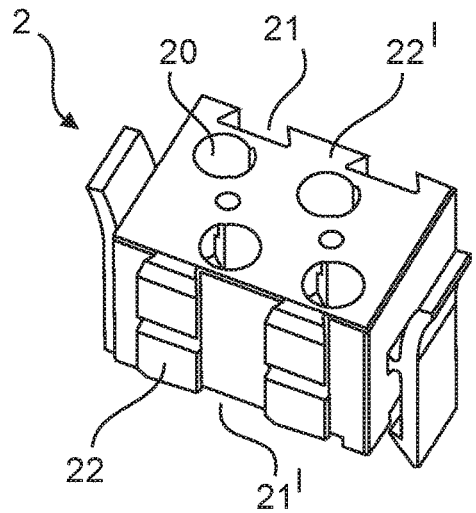
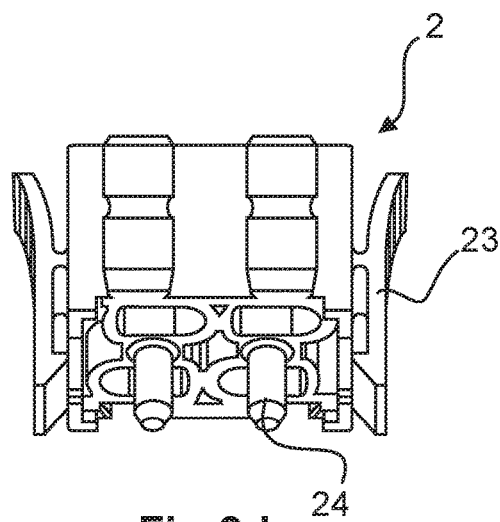
Fig.2c        Fig.2d
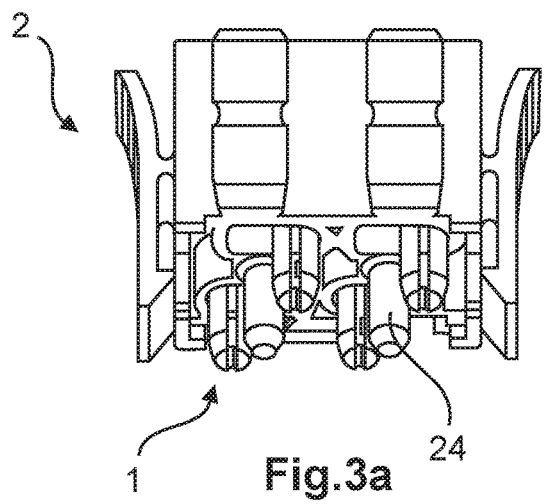
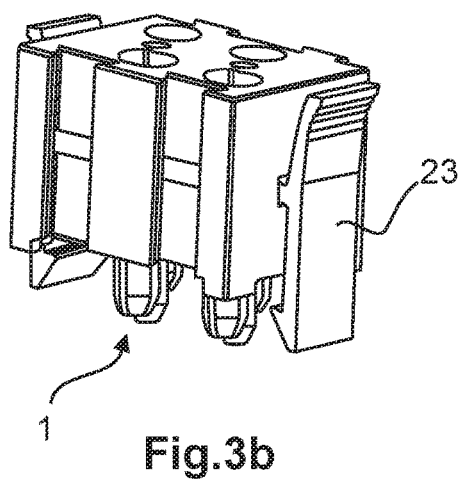
Fig.3a        Fig.3b

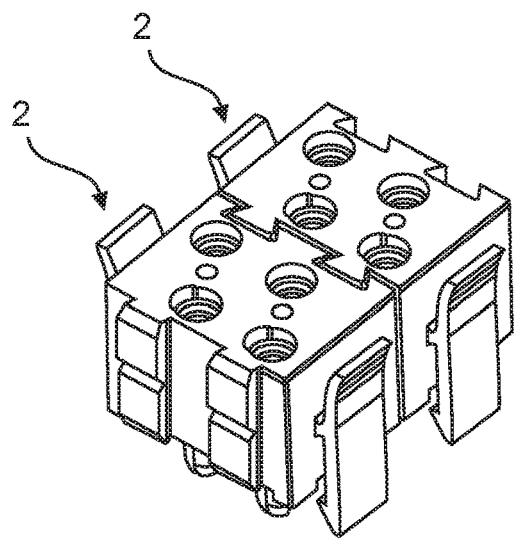
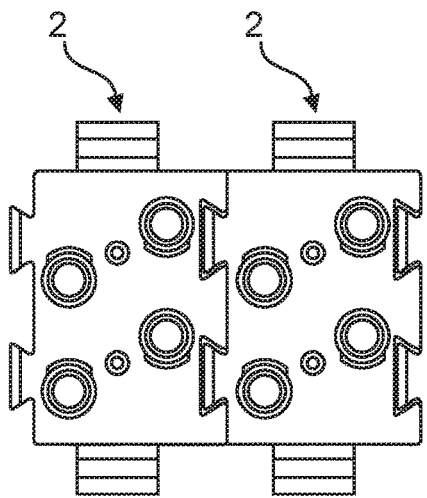
Fig.5a    Fig.5b
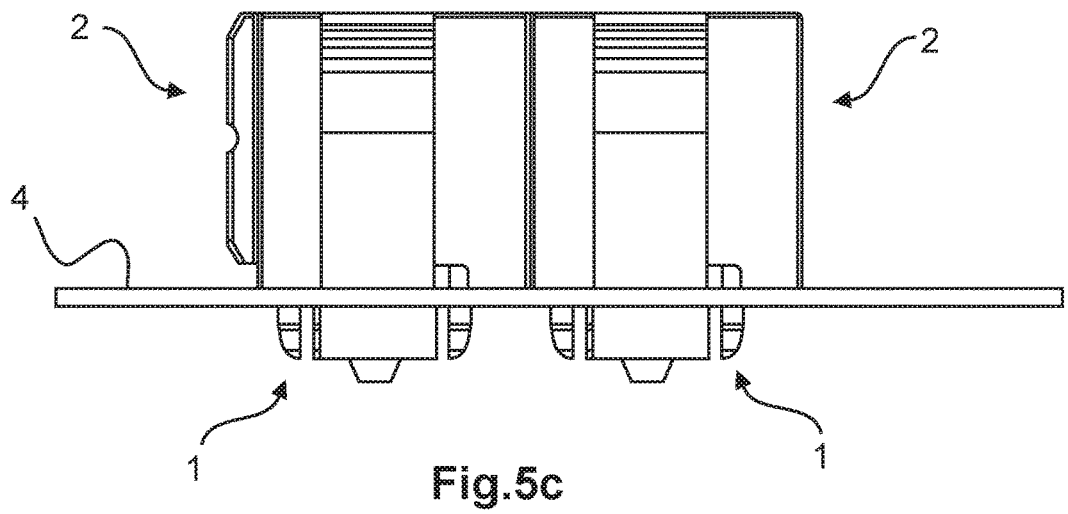
Fig.5c
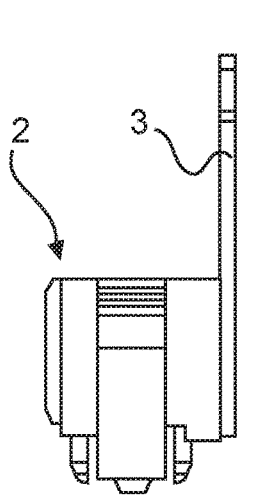
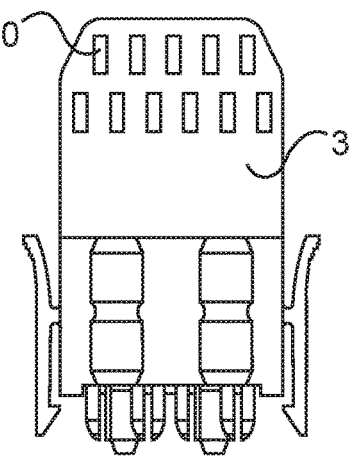
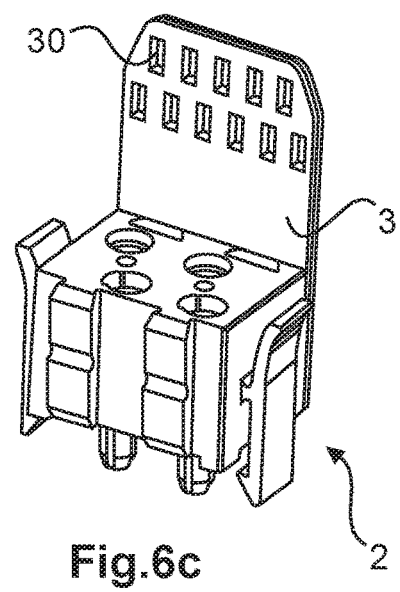
Fig.6a    Fig.6b    Fig.6c

PRINTED CIRCUIT BOARD PLUG-IN CONNECTION

BACKGROUND

Technical Field

This disclosure relates to a printed circuit board plug-in connection for connecting an electric cable to a printed circuit board.

Description of the Related Art

Printed circuit board plug-in connections can have one or more electrical plug-in contacts and are required in order to electrically connect an electric cable to a printed circuit board and also to be able to disconnect this connection again with only a low level of expenditure. In particular, printed circuit board plug-in connection then serve to transmit currents of high current intensity, called "high currents" for short, from one or more electrical conductors of the electric cable to one or more conductor tracks of the printed circuit board. Here and below, the terms "high current intensity"/ "high currents" mean, in particular, that a plug-in connection of this kind can transmit a current of, for example, at least 10 amperes, in particular at least 16 amperes, for example, at least 24 amperes, preferably at least 32 amperes and, in a particularly preferred refinement, even 40 amperes and above, for each plug-in contact.

In the prior art, a contact spring for a plug-in connector socket is known, for example, from document EP 2 572 405 B1, for the purpose of transmitting high currents from a plug-in connector to a printed circuit board. The contact spring can be soldered, on the connection side, to the printed circuit board and can be arranged in an insulating body. On the plug-in side, the contact spring can be plugged with a mating contact of a mating plug. A design in which the contact spring has a relatively large common contact area both with the plugged-in mating contact and also with the printed circuit board is proposed here. In particular, two contact springs of this kind can be soldered to two contact regions, which are situated opposite one another, of a printed circuit board, which can be populated on both sides, and two mating contacts of a single mating plug can make contact with said contact springs at the same time by way of a single plug-in process in order to transmit a particularly high current.

One disadvantage in this prior art is that, during production, the contact spring is initially produced using a stamping and bending process and usually arranged in the insulating body and has to be held in said insulating body, for example, by latching. Furthermore, the generally automated soldering process, specifically the so-called "SMT" (surface mounted technology) process, is necessary in order to solder the contact spring to the printed circuit board on the connection side. These processes are relatively complicated and can be only partially automated. Therefore, production is correspondingly expensive.

BRIEF SUMMARY

According to embodiments of the invention, a printed circuit board plug-in connection for transmitting currents which are as high as possible between a printed circuit board and an electric cable is provided in a manner which is as uncomplicated and cost-effective as possible in respect of production.

Here and below, the term "high currents" means, in particular, that the printed circuit board plug-in connection can transmit a current of, for example, at least 10 amperes ("amperes" is denoted "A" below), in particular at least 16 A, for example, at least 24 A, preferably at least 32 A and particularly preferably even 40 A and above, for each plug-in contact. That is to say, if a plurality of, for example, four, plug-in contacts belong to a printed circuit board plug-in connection, a correspondingly high current intensity, that is to say, for example, at least 40 A, in particular at least 64 A, for example, at least 96 A, preferably at least 128 A and particularly preferably even 160 A and above, can then be transmitted by the plug-in connection overall. In the plugged-in state, in each case one plug-in contact of the printed circuit board plug-in connection can usually electrically conductively connect one of the cores of the electric cable to one of the conductor tracks of the printed circuit board.

According to an embodiment of the present invention, a printed circuit board plug-in connection has an insulating body and at least one plug-in contact which is arranged in said insulating body and is designed as a pin contact with a pin axis. The at least one pin contact has a cable connection region at a connection-side end. Said pin contact has a plug-in end opposite said cable connection region. The pin contact has a connecting section between the cable connection region and the plug-in end. The pin contact further has at least one first slot which starts at the plug-in end and runs through the pin axis in the direction of the cable connection region, at least two segments of the pin contact that point in the plug-in direction being formed by said slot.

Here, it is clear to a person skilled in the art that said electric cable can be connected to the cable connection region, that is to say can be mechanically fixed to said cable connection region and can be electrically conductively connected to said cable connection region.

The pin contact can be symmetrical at least in regions, that is to say in a region of the pin contact, and can be designed in a rotationally symmetrical and/or mirror-symmetrical, in particular axially symmetrical, manner at least in this region.

The pin axis may preferably be an axis of symmetry of the pin contact or at least of a section of the pin contact.

One particular advantage of embodiments of the invention is that the at least one pin contact can be plugged directly into corresponding passage contact openings of the printed circuit board and in this way can be electrically contact-connected to the contact material, which is located in said passage contact openings, of the corresponding conductor track. Finally, the number of transfer contacts of the plug-in connection is considerably reduced in this way.

Since the printed circuit board connector has at least one slot which starts at the plug-in end and runs through its pin axis in the direction of the cable connection region, it can apply the elasticity required for the plug-in connection. In particular, its segments can move at least slightly toward one another during the plug-in operation with application of a corresponding counterforce.

The pin contact can be symmetrical at least in regions and can be designed in a rotationally symmetrical and/or mirror-symmetrical, in particular axially symmetrical, manner at least in this region. The pin axis may preferably be an axis of symmetry of the pin contact or at least of a section of the pin contact.

The pin contact can advantageously protrude through a first passage contact opening of a first printed circuit board by way of its plug-in end in the plugged-in state and in so doing make electrically conductive contact with a contact material of the printed circuit board that is arranged on—and in particular also in—the passage contact opening.

It is particularly advantageous for at least two, in particular identical, segments of the printed circuit board connector that are free-standing in the plug-in direction to be formed in the pin contact by said at least one slot in its connecting region and in the plug-in region. These at least two segments each point in the direction of the plug-in end and can be moved at least slightly toward one another by an at least slight elastic deformation of the printed circuit board connector, for example, by pressing together its plug-in region, by way of their free-standing ends. Owing to its at least one slot and its elasticity, in particular its at least slightly reversibly deformable material, in particular metal, the printed circuit board connector finally has the at least slight deformability which is required for this purpose.

During the plug-in operation, the segments can move toward one another by way of their free-standing ends, wherein their outer surfaces are ideally oriented parallel in relation to the plug-in direction and make electrically conductive contact with a contact material, which is arranged in the passage contact opening of the printed circuit board and has a common contact area which is as large as possible, with application of a corresponding outwardly acting counterforce ideally in a parallel orientation. The contact material belongs to the corresponding conductor track, that is to say it is at least electrically conductively connected to the respective conductor track.

In a particularly advantageous refinement, the printed circuit board connector additionally has a second slot which likewise starts at the plug-in end and runs in the direction of the cable connection region, which second slot intersects the first slot in said pin axis, in particular at a right angle. This is particularly advantageous because the elasticity of the printed circuit board connector is increased in this way. Finally, four, in particular identical, segments of the printed circuit board connector are formed in this way, which segments can be in particular equally, for example, in the direction of the pin axis, at least slightly elastically deflected with application of a corresponding counterforce. The outer surfaces of the segments can advantageously be designed in the form of a segment of a circle and therefore fit in an optimum manner into the, in particular, round passage contact opening.

During the plug-in operation, the at least one pin contact can be at least slightly elastically compressed by an at least slight deformation of the connecting section with application of a corresponding counterforce and press against the second contact region with the counterforce in order to make contact with said second contact region with a correspondingly high electrical conductance.

In particular, the diameter of the connecting section of the pin contact can at least slightly increase in size in the direction of the plug-in end in the non-plugged-in state. For example, the connecting section can have, at its plug-in end, a first diameter which is around at least 0.1 mm, preferably at least 0.2 mm, in particular at least 0.3 mm and particularly preferably at least 0.4 mm, greater than a second diameter which is measured in at least one other region of the connecting section, for example, in that region in which the first slot ends and/or, for example, in that region of the pin contact which adjoins the cable connection region.

It is then further particularly advantageous when the corresponding passage contact opening of the printed circuit board has a diameter which corresponds to said second diameter. Since the passage contact opening of the printed circuit board generally has a cylindrical shape, an optimum contact area with the pin contact is finally provided precisely when the outer contours of the segments of the pin contact are oriented parallel to one another in the plugged-in state, while they are oriented slightly outward in the plug-in direction in the non-plugged-in state.

It goes without saying that the printed circuit board connector can have, in addition to the first and the second slot, one or more further slots, that is to say can have a total of three, four, five, . . . , n slots of this kind, where n is any desired natural number. These slots can create a corresponding large number of segments. However, it should be noted here that both the contact area of the printed circuit board connector and also the counterforce which it applies counter to the deformation decrease as the number and/or width of the slots decreases.

Therefore, the abovementioned variant of two slots which intersect at a right angle in the pin axis has been found to be particularly advantageous in practice. As a result, four identical segments can be formed in the plug-in section and in the connecting section of the printed circuit board connector, which segments deform uniformly under a uniform loading.

In a further advantageous refinement, the slot/slots ends/end either in the connecting section or at the latest at the end of the connecting section. This is particularly advantageous because the cable connection region, which is provided for making contact with the printed circuit board, is of solid design in this way since it therefore has no slots. Finally, said cable connection region can be particularly readily soldered to the first printed circuit board as a result.

The pin contact, for the purpose of elastic deformation of said pin contact when it is plug-connected to a contact opening, for example, the contact opening of a second printed circuit board, is advantageously formed from an at least slightly reversibly deformable, electrically conductive material. In particular, the pin contact can be formed from metal, this advantageously being of benefit in respect of the mechanical properties and additionally the electrical conductivity.

In an advantageous refinement, the printed circuit board connector, in its basic form, can be a rotary part. As a result, it is very stable and can be produced in an automated and therefore cost-effective manner. In particular, the at least one slot can be made in the pin contact with only a low level of expenditure, for example, by sawing or milling.

The printed circuit board plug-in connector can furthermore have the printed circuit board, or at least those parts of the printed circuit board which are required for the plug-in connection. These parts can include, in particular, the passage contact opening with the contact material arranged in said passage contact opening.

Furthermore, the insulating body can have latching means or devices, in particular two latching arms which are integrally formed on said insulating body in an elastic manner opposite one another. The printed circuit board can have corresponding mating latching means or devices, in particular latching openings, through which the latching arms pass in a releasably latching manner during the plug-in process. Furthermore, the printed circuit board can have positioning means or devices, in particular positioning passage openings. The insulating body can have corresponding centering pins which taper at their ends, said insulating body being positioned in an optimum manner by said centering pins by way of interacting with these positioning passage openings during the plug-in operation.

In a particularly advantageous refinement, the insulating body can have mechanical connecting means or devices, in particular dovetail-like moldings, on two sides which are situated opposite one another. Said mechanical connecting means or devices serve, amongst other things, for attaching further insulating bodies in the form of a cascade, so that the printed circuit board plug-in connector can be extended as desired in this way by attaching further insulating bodies.

Furthermore, in a further advantageous refinement, a strain-relief element can be attached to the mechanical connecting means or devices, which strain-relief element may possibly have corresponding dovetail connections.

The plug-in contact, which is said pin contact in particular, can have, in its cable connection region, a crimp connection for connection to a corresponding core of the electric cable. As an alternative, further connection options, for example, a screw contact or a spring contact, are known to a person skilled in the art.

BRIEF DESCRIPTION OF THE SEVERAL VIEWS OF THE DRAWINGS

An exemplary embodiment of the invention is illustrated in the drawings and will be explained in more detail below. In the drawings:

FIGS. 2a-d show various views of an insulating body;
FIGS. 3a-b show the insulating body fitted with the pin contacts;
FIGS. 5a-b show two insulating bodies which are fastened to one another;
FIG. 5c shows the two insulating bodies which are fastened to one another and are fastened on a further printed circuit board;
and
FIGS. 6a-c show the insulating body with a strain-relief device.

The figures may contain partially simplified, schematic illustrations. In some cases, identical reference signs are used for similar, but possibly not identical, elements. Various views of the same elements could be drawn to different scales.

DETAILED DESCRIPTION

Figure 1A:
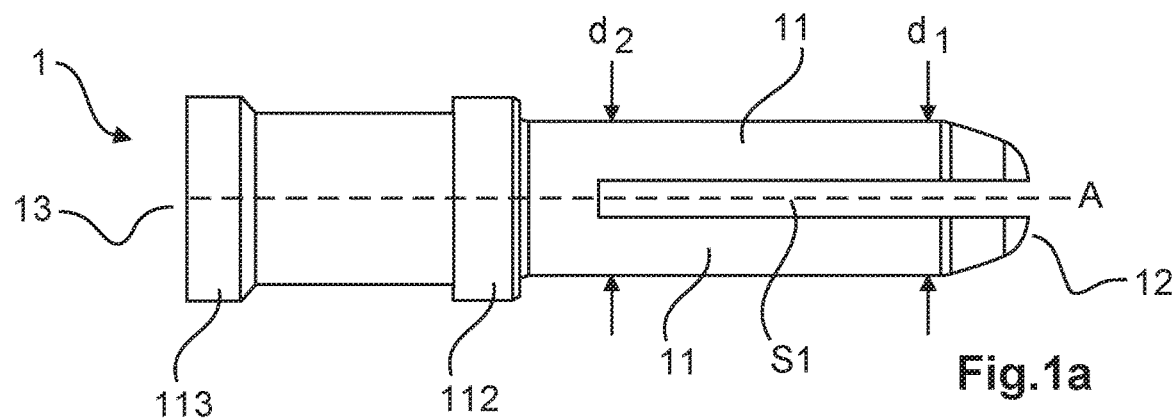
FIGS. 1a-c show various views of a pin contact.
Figure 1B:
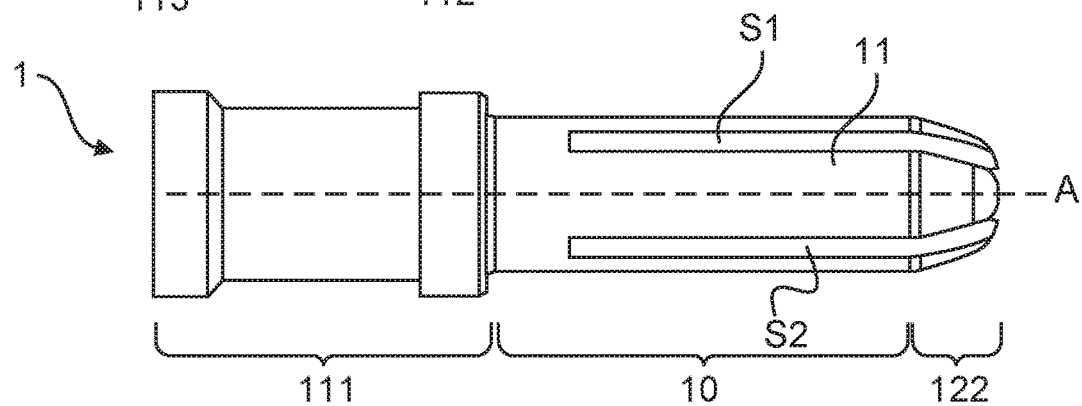
Figure 1C:
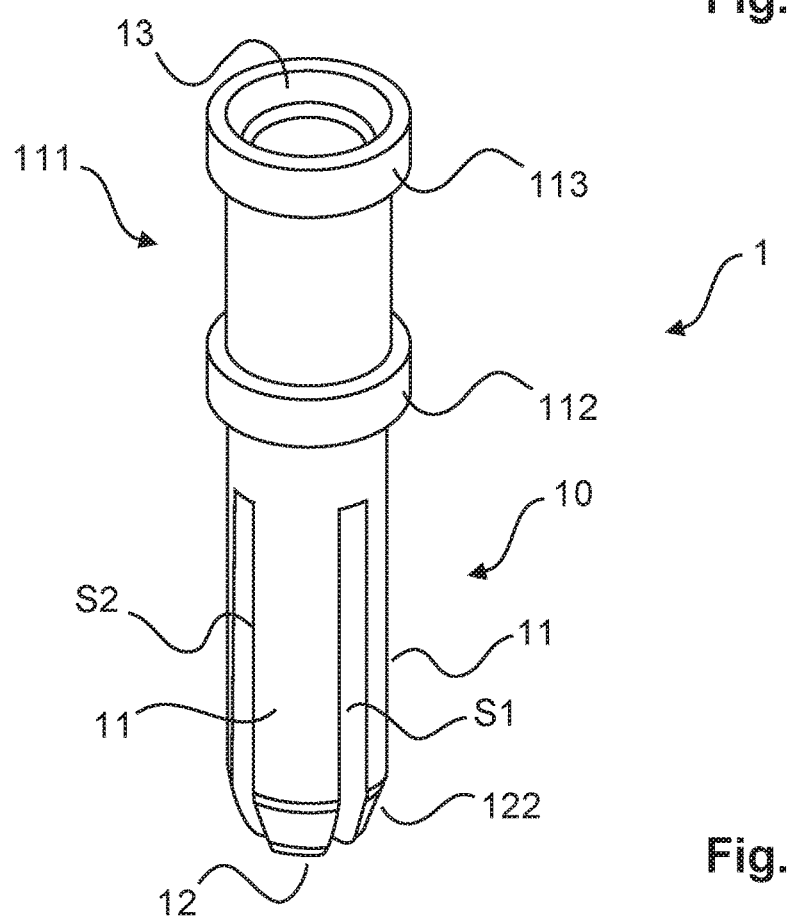

FIGS. 1a-c show various views of a pin contact 1 with an axis of symmetry which is denoted pin axis A. The pin contact 1 has a cable connection region 111 which is designed as a crimp region. The cable connection region 111 is of hollow-cylindrical form in the basic state, that is to say in the non-crimped state, and has, at its cable connection-side end, a cable insertion opening 13 with an insertion collar 113 for receiving and making electrical contact with a core of an electric cable, not illustrated in the drawing. At its other end, the cable connection region 111 has a connecting collar 112 by way of which it is connected to a connecting section 10.

At its plug-in end 12, the pin contact 1 has a tapering section 122 which is connected to the cable connection region 111 by way of the connecting section 10.

As is clear from FIG. 1a, the pin contact 1 has at least one first slot S1, which starts at the plug-in end 12 and runs through the pin axis A in the direction of the cable connection region 111, at least two segments 11 which point in the plug-in direction being formed by said slot S1. Furthermore, the pin contact 1 has, at its plug-in end, a first diameter $d_1$, which is around at least 0.1 mm greater than a second diameter $d^2$ which is arranged in that region in which the first slot S1 ends.

As is illustrated in FIG. 1b, the pin contact 1 additionally has a second slot S2. Said second slot S2 likewise starts at the plug-in end 12 and runs in the direction of the cable connection region 111, wherein said second slot S2 intersects the first slot S1 at a right angle in the pin axis A. Four identical segments 11 which point in the plug-in direction are formed by said two slots S1, S2.

FIG. 1c shows a 3D illustration of the pin contact 1. In particular, the cable insertion opening 13 of the cable connection region/crimp region 111 can be seen particularly clearly here. Furthermore, the way in which the segments 11 are formed by the two slots S1, S2 is particularly readily clear.

FIGS. 2a-d show various views of an insulating body 2. FIG. 2a shows a side view of the insulating body. Said insulating body has, on two narrow sides which are situated opposite one another, in each case one latching arm 23 and, on a printed circuit board connection side, two centering pins 24.

Contact receptacles 20 can be particularly clearly seen in FIG. 2b. Said contact receptacles 20 are designed as passage openings into which the pin contacts 1 can be inserted and in which said pin contacts 1 can latch.

Furthermore, the insulating body has, on two longitudinal sides which are situated opposite one another, in each case one fastening apparatus in the form of a dovetail connection with in each case at least one peg 22, 22' and in each case one corresponding recess 21, 21'.

FIG. 2c shows the insulating body in an oblique plan view of the cable connection side. FIG. 2d shows the insulating body 2 looking at the plug-in side.

FIGS. 3a and 3b show the insulating body 2 with the pin contacts 1 which are received in the contact receptacles 20.

Figure 4A:
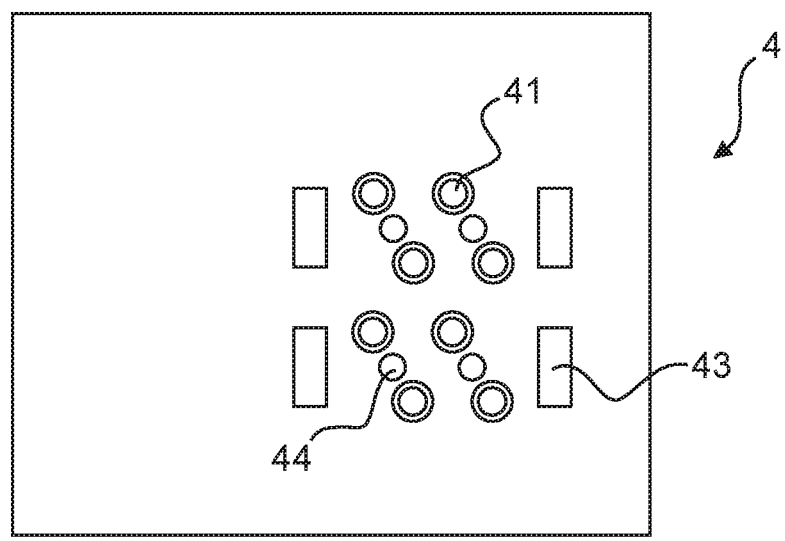
FIGS. 4a-b show a printed circuit board.
Figure 4B:
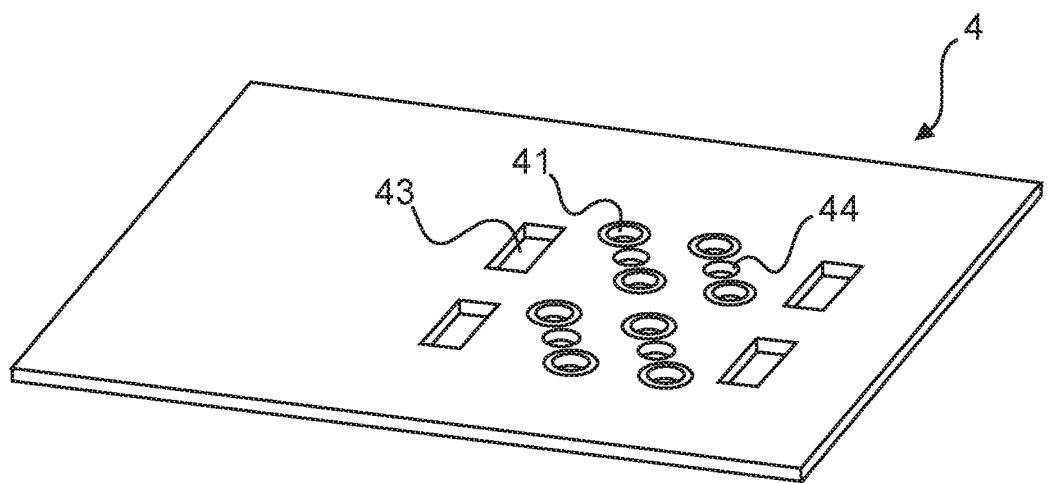

FIGS. 4a and 4b show a plan view and an oblique plan view of a printed circuit board 4. Said printed circuit board 4 has latching openings 43 which are suitable for the latching arms 23 of the insulating body 2 to pass through in a releasably latching manner. Furthermore, the printed circuit board 4 has passage contact openings 41 with contact material, which is arranged in said passage contact openings, for inserting and making electrical contact with the pin contacts 1. The contact material is electrically conductively connected to conductor tracks, not illustrated, of the printed circuit board 4. Furthermore, the printed circuit board 4 has positioning passage openings 44.

Figure 4C:
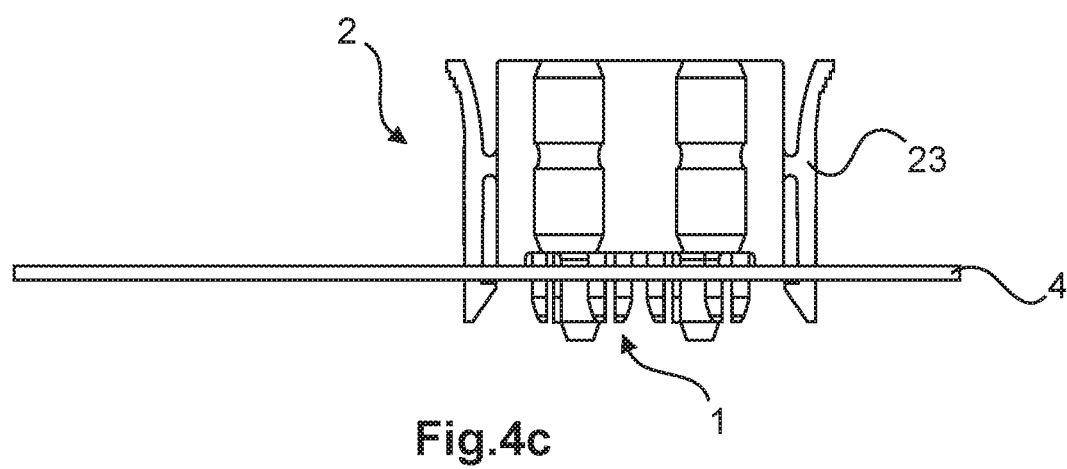
FIG. 4c shows the insulating body which is arranged on the printed circuit board.

FIG. 4c shows the printed circuit board 4 with the insulating body 2 releasably latched to said printed circuit board and the pin contacts 1 which are arranged in said insulating body and plugged into the passage contact openings 41.

FIGS. 5a and 5b show two insulating bodies 2 which are fastened to one another by way of their fastening apparatuses.

FIG. 5c shows the two insulating bodies 2 which are fastened to one another and are jointly latched to the printed circuit board 4, wherein the pin contacts 1 which are received in the insulating bodies 2 are plugged into the passage contact openings 41 and in so doing make electrical contact with the contact material which is arranged in said passage contact openings 41. During the plug-in process, the positioning of the insulating bodies 2 and therefore also the positioning of the pin contacts 1 by way of interaction of the centering pins 24 with the positioning passage openings 44 of the printed circuit board 4.

FIGS. 6*a-c* illustrate a strain-relief element 3 in conjunction with the insulating body 2. The strain-relief element 3 likewise has a fastening apparatus which corresponds to the fastening device of the insulating bodies. Furthermore, the strain-relief element 3 has fastening openings 30 to which cores of the cable, not shown, can be fastened, for example, by way of cable ties.

Even if different aspects or features of the invention are shown in the figures in combination in each case, it is obvious to the person skilled in the art—unless otherwise indicated—that the illustrated and discussed combinations are not the only possible combinations. In particular, units or feature complexes of different exemplary embodiments that correspond to one another may be exchanged with one another.

Put another way, aspects and features of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A printed circuit board plug-in connection for connecting an electric cable to a printed circuit board, the printed circuit board plug-in connection comprising:
   at least one insulating body including at least one centering pin for aligning the insulating body relative to the printed circuit board, and including latching arms for latching the insulating body to the printed circuit board; and
   at least one pair of adjacent pin contacts arranged in the insulating body;
   wherein each pin contact of the at least one pair of adjacent pin contacts has a pin axis and has a cable connection region at a connection-side end and, opposite to the connection-side end, has a plug-in end, wherein the pin contact has a connecting section between the cable connection region and the plug-in; and
   wherein the at least one centering pin of the insulating body is located between the pair of adjacent pin contacts in an area between the latching arms of the insulating body; and
   the printed circuit board includes latching openings for insertably receiving the latching arms of the insulating body, at least one positioning passage opening that is separate and distinct from the latching openings for insertably receiving the at least one centering pin of the insulating body.

2. The printed circuit board plug-in connection as claimed in claim 1, wherein the pin contact is formed from an at least slightly reversibly deformable, electrically conductive material.

3. The printed circuit board plug-in connection as claimed in claim 1, wherein the pin contact is formed from metal.

4. The printed circuit board plug-in connection as claimed in claim 1, wherein the pin contact is substantially cylindrical.

5. The printed circuit board plug-in connection as claimed in claim 1, wherein the slot is made in the pin contact by sawing or milling.

6. The printed circuit board plug-in connection as claimed in claim 1, wherein the pin contact is symmetrically formed at least in sections, and that the pin axis is an axis of symmetry of the pin contact at least in regions.

7. The printed circuit board plug-in connection as claimed in claim 1, wherein a diameter of the connecting section is at least slightly increased in size in the direction of the plug-in end in a non-plugged-in state.

8. The printed circuit board plug-in connection as claimed in claim 1, wherein the printed circuit board includes a pair of passage contact openings corresponding to the pair of adjacent pin contacts arranged in the insulating body, and wherein the positioning passage opening of the printed circuit board is located between the pair of passage contact openings.

9. The printed circuit board plug-in connection as claimed in claim 1, wherein a terminal end of the centering pin of the insulating body extends in the plug-in direction beyond terminal ends of the at least one pair of adjacent pin contacts.

10. The printed circuit board plug-in connection as claimed in claim 1, wherein each pin contact has at least one first slot which starts at the plug-in end and runs through the pin axis in a direction of the cable connection region, and wherein at least two segments of the pin contact that point in a plug-in direction are formed by said at least one first slot.

11. The printed circuit board plug-in connection as claimed in claim 1, wherein the circuit board includes at least one passage contact opening having contact material arranged in said passage contact opening for insertably receiving and making contact with at least one pin contact of the at least one pair of adjacent pin contacts.

12. The printed circuit board plug-in connection as claimed in claim 1, wherein the centering pin and the pair of adjacent pin contacts are provided in a linear array along a direction that is oblique to a longitudinal length of the insulating body.

13. The printed circuit board plug-in connection as claimed in claim 12, wherein the latching arms and the centering pin are provided in a linear array along a direction that is parallel to the longitudinal length of the insulating body.

14. The printed circuit board plug-in connection as claimed in claim 1, wherein the printed circuit board plug-in connection comprises at least two pairs of adjacent pin contacts arranged in the insulating body, wherein the insulating body comprises at least two centering pins, and wherein each centering pin is located between a respective one of the at least two pairs of adjacent pin contacts.

15. The printed circuit board plug-in connection as claimed in claim 14, wherein each centering pin and the respective pair of adjacent pin contacts are provided in a linear array along a direction that is oblique to a longitudinal length of the insulating body.

16. The printed circuit board plug-in connection as claimed in claim 1, wherein the pin contact additionally has a second slot which likewise starts at the plug-in end and runs in the direction of the cable connection region, which second slot intersects the first slot in the pin axis, as a result of which four segments which point in the plug-in direction are formed.

17. The printed circuit board plug-in connection as claimed in claim 16, wherein the first slot and the second slot intersect at a right angle in the pin axis.

18. The printed circuit board plug-in connection as claimed in claim 16, wherein the first and second slots end either in the connecting section or at the latest at the end of the connecting section.

19. The printed circuit board plug-in connection as claimed in claim 1, wherein the plug-in connection has a plurality of insulating bodies which each have a fastening apparatus for mutual mechanical fastening.

20. The printed circuit board plug-in connection as claimed in claim 19, wherein each of the insulating bodies has dovetail-like pegs and recesses as the fastening apparatus on two sides which are situated opposite one another.

21. The printed circuit board plug-in connection as claimed in claim 19, wherein each insulating body has latching arms for latching to the printed circuit board.

22. A printed circuit board plug-in connection for connecting an electric cable to a printed circuit board, the printed circuit board plug-in connection comprising:
   a plurality of insulating bodies which each have a fastening apparatus for mutual mechanical fastening; and
   at least one pin contact which is arranged in one of said plurality of insulating bodies, has a pin axis and has a cable connection region at a connection-side end and, opposite to the connection-side end, has a plug-in end, wherein the pin contact has a connecting section between the cable connection region and the plug-in end, wherein the pin contact has at least one first slot which starts at the plug-in end and runs through the pin axis in a direction of the cable connection region, and wherein at least two segments of the pin contact that point in a plug-in direction being formed by said at least one first slot, and
   wherein the plurality of insulating bodies are arranged and fastened one to the other and a strain-relief element is fitted to the fastening apparatus of a free-standing side of one of the plurality of insulating bodies which is located at one end of the arrangement.

* * * * *